(12) United States Patent
Lui

(10) Patent No.: US 7,872,469 B2
(45) Date of Patent: Jan. 18, 2011

(54) APPARATUS AND METHODS OF INTEGRATED-CIRCUIT DEVICE TESTING

(75) Inventor: Jackson Lui, Ramona, CA (US)

(73) Assignee: QUALCOMM Incorporated, San Diego, CA (US)

( * ) Notice: Subject to any disclaimer, the term of this patent is extended or adjusted under 35 U.S.C. 154(b) by 315 days.

(21) Appl. No.: 12/053,358

(22) Filed: Mar. 21, 2008

(65) Prior Publication Data

US 2009/0079419 A1 Mar. 26, 2009

Related U.S. Application Data

(60) Provisional application No. 60/975,091, filed on Sep. 25, 2007.

(51) Int. Cl.
*G01R 1/02* (2006.01)
(52) U.S. Cl. .................................. 324/158.1
(58) Field of Classification Search ............... 324/754, 324/765, 761–762, 760, 158.1; 438/14–18; 257/48
See application file for complete search history.

(56) References Cited

U.S. PATENT DOCUMENTS

| 7,138,811 | B1 * | 11/2006 | Mahoney et al. ............ 324/754 |
| 7,307,433 | B2 * | 12/2007 | Miller et al. ................ 324/754 |
| 7,535,244 | B2 * | 5/2009  | Kim .......................... 324/765 |

* cited by examiner

*Primary Examiner*—Ha Tran T Nguyen
*Assistant Examiner*—Tung X Nguyen
(74) *Attorney, Agent, or Firm*—Jiayu Xu

(57) ABSTRACT

A motherboard device (MB) interface board (DIB) configured as universal interface to a family of integrated circuit (IC) devices provides the electrical connectivity to automated test equipment (ATE) and physical mating commonality with an IC device handler for reduced time to market and enhanced economy for design validation and production verification testing. In particular, use of one or more daughter cards (DC) that mount to the MB DIB avoid redesign of the entire DIB assembly for a new IC design. Each DC can be more quickly designed at a lower cost than the entire DIB assembly, enabling replacement of any defective site. The DC increases the available surface area for mounting of support components for the device under test (DUT).

15 Claims, 7 Drawing Sheets

APPARATUS AND METHODS OF INTEGRATED-CIRCUIT DEVICE TESTING

CLAIM OF PRIORITY UNDER 35 U.S.C. §119

The present Application for patent claims priority to Provisional Application No. 60/975,091 entitled "AUTOMATIC TEST EQUIPMENT MODULARITY IMPROVES GAGE PERFORMANCE: A MOTHERBOARD AND DAUGHTERCARD CONCEPT" filed 25 Sep. 2007, and assigned to the assignee hereof and hereby expressly incorporated by reference herein.

FIELD OF INVENTION

The present application relates generally to semiconductor processes and, more specifically, to methods and systems to increase performance through improved device interface board design and automatic test equipment modularity.

BACKGROUND

In order to be competitive, semiconductor manufacturers strive to reduce the time to market for design, manufacture, validation and delivery of integrated circuit (IC) devices. In addition, to time, significant development has been invested in making each step in the process more economical, such as validation testing. In particular, automated test equipment (ATE) is programmed to support, stimulate and sense operating parameters of a given IC device. A handler positions each IC device for testing by the ATE, and the testing results in separately binning good and bad IC devices.

Significant hardware investment has been made in ATE and handler equipment suitable for validation testing of a wide range of IC devices. For example, ATE incorporates a wide array of capabilities for providing radio frequency (RF) signals and sensing, various digital signal inputs and outputs, etc. In order to multiply the throughput of such ATE, typically each ATE can simultaneously test a plurality of IC devices, supported by handlers designed for simultaneously placing and retrieving these IC devices under test (DUT). A degree of standardization in such equipment occurs in order to make them more economical and to reduce the training time required for programmers of such ATE and handlers. To that end, each validation testing effort has to be adapted to the electrical capabilities and constraints of the ATE and to the hardware configuration and limitations of the handler.

A typical device interface board (DIB) design used by all semiconductor manufacturers consists of a printed circuit board (PCB) with all the essential supporting components and circuits along with a test socket. Test software is then written to provide instructions to the ATE on the stimulus to provide and the measurements to make. Ultimately, a decision will be made to distinguish a good part from a bad part, also commonly termed as binning. A DIB may come in different shapes and sizes, but the concept is the same.

Although standardization of ATE and handlers is desirable, a challenge is presented by an ongoing effort to make IC devices smaller and more capable, which often means increasing complexity in interfacing to the IC device (e.g., increased pin count, increased numbers of inputs and outputs, etc.). This increased complexity is accommodated by designing a custom DIB that mounts to the ATE for providing one or more custom test sites for receiving IC devices from the handler. A printed circuit board (PCB) of the DIB is increasing in the number of layers (e.g., 22, 24, etc.) that are required to provide the required connectivity and supporting signals. Area available for mounting support components (e.g., lumped electronic components) is generally limited to an underside of the PCB because an upper surface is limited by clearance for the handler and for docking sites.

Another challenge is that the multiple test sites on the DIB require traces that perform identically so that shared signals test each IC device identically. The large size of the DIB and the traces, with some by necessity being routed differently in length, make such designs problematic.

Even if these constraints can be satisfied, the large size of the PCB for the DIB makes design of each layer time consuming, with current benchmarks indicating that an experienced design engineer requires one day per layer. Thus, it is not uncommon for the length of time required to design a DIB to become the critical path rather than the manufacture of a new IC device. This is increasingly a challenge, as conventional DIBs need to have additional layers to support complex IC devices.

Yet another challenge is that manufacturing costs are based upon assumptions that each ATE is being operated at capacity. However, when one test site fails on a multiple test site DIB, the rate of validation testing goes down. Each DIB has a cost that is prohibitive in provisioning spares and is expensive to diagnose and repair. For example, it is common for a DIB to currently cost $30,000 for a replacement.

Towards the end of the hardware and software development cycle, engineers need to perform a Gage study to determine repeatability (i.e., data variation when tested multiple times) and reproducibility (i.e., data reproduction using multiple correlated testers), which provides as indicators of quality and stability of the final test solution. Sample data is collected across multiple ATE testers, DIBs, and devices to derive the mean and standard deviation from which a user can determine the acceptability of the final test solution. In the detailed description, embodiments will be presented to improve overall performance by yielding better Gage results. Improvements in performance as shown in a Gage study will correlate to the speed of which a product can be brought to market/production as well as the quality of the test solution, all of which fortifies a company's leadership in a specific market space. It is thus a challenge to make corrections to satisfy a Gage study if a change to the DIB is necessary.

SUMMARY

The following presents a simplified summary in order to provide a basic understanding of some aspects of the disclosed aspects. This summary is not an extensive overview and is intended to neither identify key or critical elements nor delineate the scope of such aspects. Its purpose is to present some concepts of the described features in a simplified form as a prelude to the more detailed description that is presented later.

In accordance with one or more aspects and corresponding disclosure thereof, various aspects are described in connection with providing device interfaces for design validation testing and production verification testing of integrated devices. In particular, these device interfaces maintains electrical connectivity to automated test equipment (ATE) and physical mating commonality with an IC device handler yet achieves reduced time to market and enhanced economy. In particular, a common device interface board (DIB) can be used universally for a family of integrated devices, including a new design that is not yet complete. A much smaller and less expensive daughter card is designed when the integrated device design is available, avoiding the time and expense of designing, manufacturing and repairing a conventional unitary DIB.

In one aspect, an apparatus is provided for reduced time to market and enhanced economy for design validation and production verification testing. A common device interface board (DIB) is sized for and electrically interfaced for being received by automated test equipment and presents a card-mounting fixture. A daughter card is attached to the card-mounting fixture and electrically interfaced thereby to the automated test equipment via the common DIB to form a DIB assembly. A test site attached to the daughter card and positioned by the DIB assembly receiving integrated devices for testing from a handler.

In another aspect, a method is provided for reduced time to market and enhanced economy for design validation and production verification testing. Creating a common device interface board (DIB) that is sized for and electrically interfaced for being received by automated test equipment and presenting a card-mounting fixture can be achieved in advance of a design for an integrated device. A DIB assembly is formed by attaching a daughter card to the card-mounting fixture and electrically interfacing thereby to the automated test equipment via the common DIB. Then testing can be performed by inserting an integrated device with a handler into a test site attached to the daughter card.

In yet another aspect, an apparatus for reduced time to market and enhanced economy for design validation and production verification testing provides means for creating a common device interface board (DIB) sized for and electrically interfaced for being received by automated test equipment and presenting a card mounting fixture. In addition, means are provided for attaching a daughter card to the card-mounting fixture and electrically interfacing thereby to the automated test equipment via the common DIB to form a DIB assembly. Further, means are provided for inserting an integrated device with a handler into a test site attached to the daughter card.

To the accomplishment of the foregoing and related ends, one or more aspects comprise the features hereinafter fully described and particularly pointed out in the claims. The following description and the annexed drawings set forth in detail certain illustrative aspects and are indicative of but a few of the various ways in which the principles of the aspects may be employed. Other advantages and novel features will become apparent from the following detailed description when considered in conjunction with the drawings and the disclosed aspects are intended to include all such aspects and their equivalents.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

Figure 1:
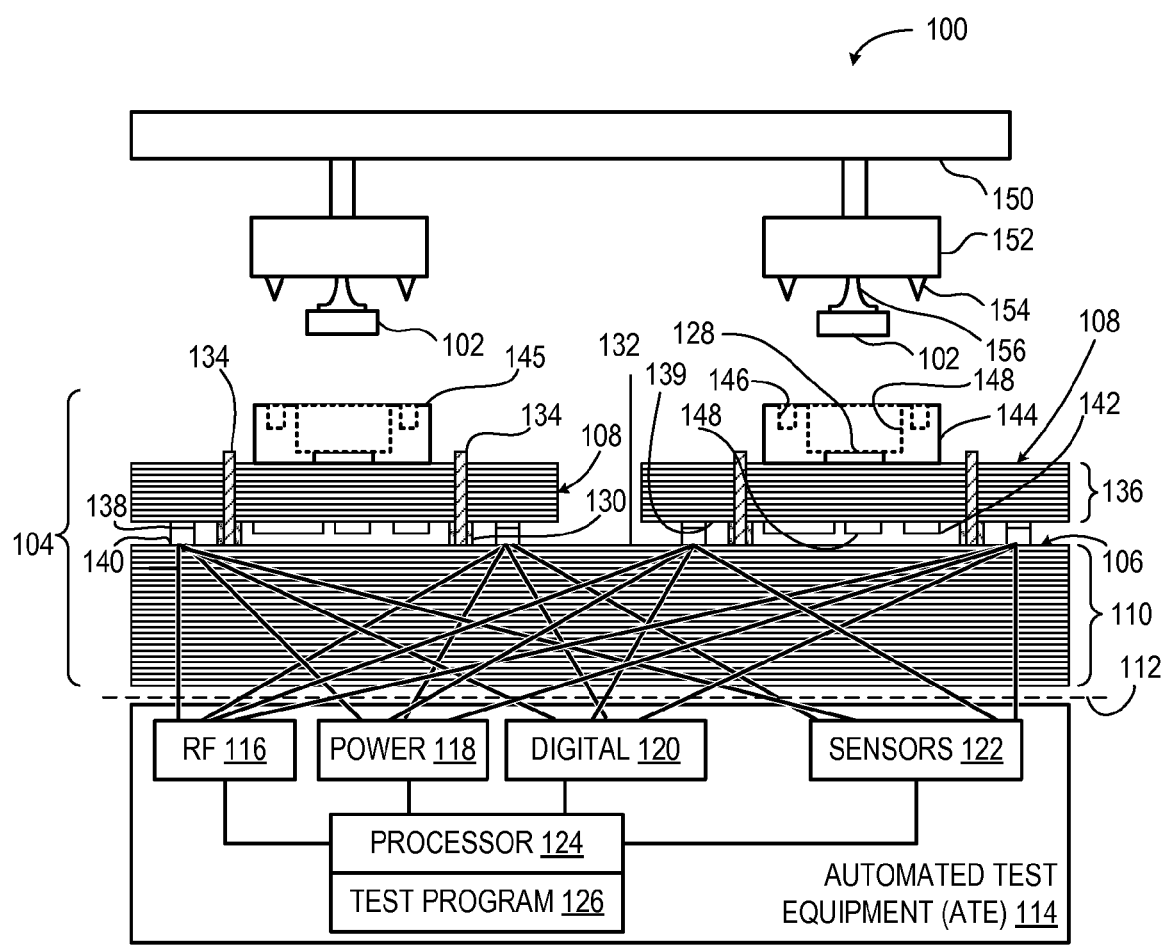
FIG. 1 illustrates a schematic diagram with a vertical cross section portion of a handler positioning two integrated circuit (IC) devices under test (DUT) in corresponding daughter card sites independently connected to a motherboard of a device interface board (DIB) assembly.

The cost of DIB design increases as the complexity of chips increase over time, which has lengthened time to market, raised the cost of hardware, forced cutting of edge vendors, and increased the need for highly skilled engineers. More CAD personnel are required to maintain the same rate at which products are developed due to the extended time required for complex routing and reviews. DIB complexity has increased, for example including 22 layers, to accommodate smaller high-density packages with increased turn-around times from the board fabrication manufacturer. Large-scale chip integration requires careful DIB routing to ensure performance and testability, all of which requires teams of engineers for review and debug.

With commodity parts such as power management devices, price and cost is a gating factor in the success of a company. Cost of test contributions to the bottom line are significant, and by finding innovative ways to address these issues, manufacturers can stay competitive.

The goal is to simplify the DIB design so that the time needed to design, layout, build, and debug is also reduced. The simplification process leads to cost reduction, reduced time to market, reduction in the need for highly skilled engineers, increased modularity, promotion of standardization, and increases in testing performance and efficiency.

Since multiple devices (sites) are tested at the same time, each site is thus treated independently. By outlining each test site with an imaginary rectangular box a separate daughter card can be created and an electrical connection may be provided via a mating connector. By doing so, a "motherboard" becomes a universal or common board that can be used with all future PMIC devices. This lends to reusability and facilitates the debug process.

In an illustrative implementation, the daughter cards are then treated individually instead of as a group, such as the group of four on a prior art DIB. As such, the described aspects allow for the layout of one site instead of four, thereby reducing the CAD layout time by 75%, dramatically reducing the team review process, and improving effectiveness by making for a smaller design. Since each daughter card is identical in layout, the performance characteristics of each site are the same, which lends towards improved repeatability and reproducibility. This is evident in improved yields and reduced retest rates, as evidenced by several Gage studies. The debug process is shortened because there is less hardware to debug and the daughter cards can go on any test site and any motherboard, which drastically simplifies this process by being able to reduce the number of variables.

While in production, there is no longer a need for debug if a site goes down. Instead of attempting to debug a prior art unitary DIB with multiple sites, the described aspects allow for a new pre-validated daughter card, which is independent from the DIB, to be used as a replacement, allowing the old daughter card to be discarded. This will prove to be much more cost effective as the price of daughter card replacements is significantly cheaper than engineering debug time and resource allocation. Otherwise, the entire DIB needs to be sent back for timely debug and additional spares are required as a backup, further increasing cost and test site maintenance. Further improvements are easily made since only the daughter cards needs to be changed and improved instead of the entire DIB. This makes hardware deployment on any project that much easier.

A motherboard device interface board (DIB) configured as a universal interface to a family of IC devices, including but not limited to, for example, power management integrated circuits (PMIC), may include symmetry of the placement and mating structures for modularity, simplicity, and maximum configurability. The end user can hand pick the best of the bench to yield improved performance and robustness; of which all contributes to the company's bottom line and strengthens its market position in producing quality product in a short time without compromising on quality.

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

In FIG. 1, a validation test apparatus 100 for integrated circuit (IC) devices under test (DUT) 102 advantageously utilizes a device interface board (DIB) assembly 104 that increases commonality and universality for economy by utilizing a universal motherboard ("common device interface board") 106. Additionally, apparatus 100 is readily configurable and repairable with one or more (two are illustrated in FIG. 1) separate and independent daughter cards 108 customized for the design of the IC DUT 102.

The motherboard 106 can include a multi-layer printed circuit board (PCB) 110 that provides sufficient electrical connectivity to a test connector 112 for all of the required stimuli, support and sensing from an automated test equipment (ATE) 114. For clarity, these interconnections are depicted functionally as being interfaced to radio frequency (RF) components 116, power components 118, digital switching components 120 and sensors 122 under the control of an automatic test equipment (ATE) processor 124 executing an ATE test program 126. The traces and inter-layer connections (not shown) that provide these communication paths to the test connector 112 can be generalized to provide symmetrical support to each test site 128 provided by the one or more daughter cards 108, as well as a range of possible signals to accommodate a broad range of currently produced IC devices 102 as well as those foreseeable in the future.

A pair of stiffener rails 130 attached to a top surface 132 of the PCB 110 of the motherboard 106 supports a respective daughter card 108 that is registered by a pair of fasteners 134, each passing through the motherboard, rail 130 and one side of a daughter card PCB 136. The spacing provided by the stiffener rails 130 provides for downwardly projecting male connectors 138 on an undersurface 139 the daughter card 108 to be received in upwardly projecting female connectors 140 on the top surface 132 of the motherboard 106, laterally positioned outside of the rails 130. Spacing is also provided for mounting fixtures 142 on the undersurface of the daughter card PCB 136 fastened to a test site base 144 on an upper surface 145 having upwardly open guide holes 146 about a central aperture 148 for receiving one of the IC DUTs 102. The undersurface 139 of the daughter card PCB 136 also provides area for placing support components 148 needed for the operation of the IC DUT 102 (e.g., RLC components).

A handler 150 horizontally and vertically positions a chuck 152 for each test site 128, registered by downward pins 154, with the IC device 102 inserted into the test site 128 by a plunger 156.

Figure 2:
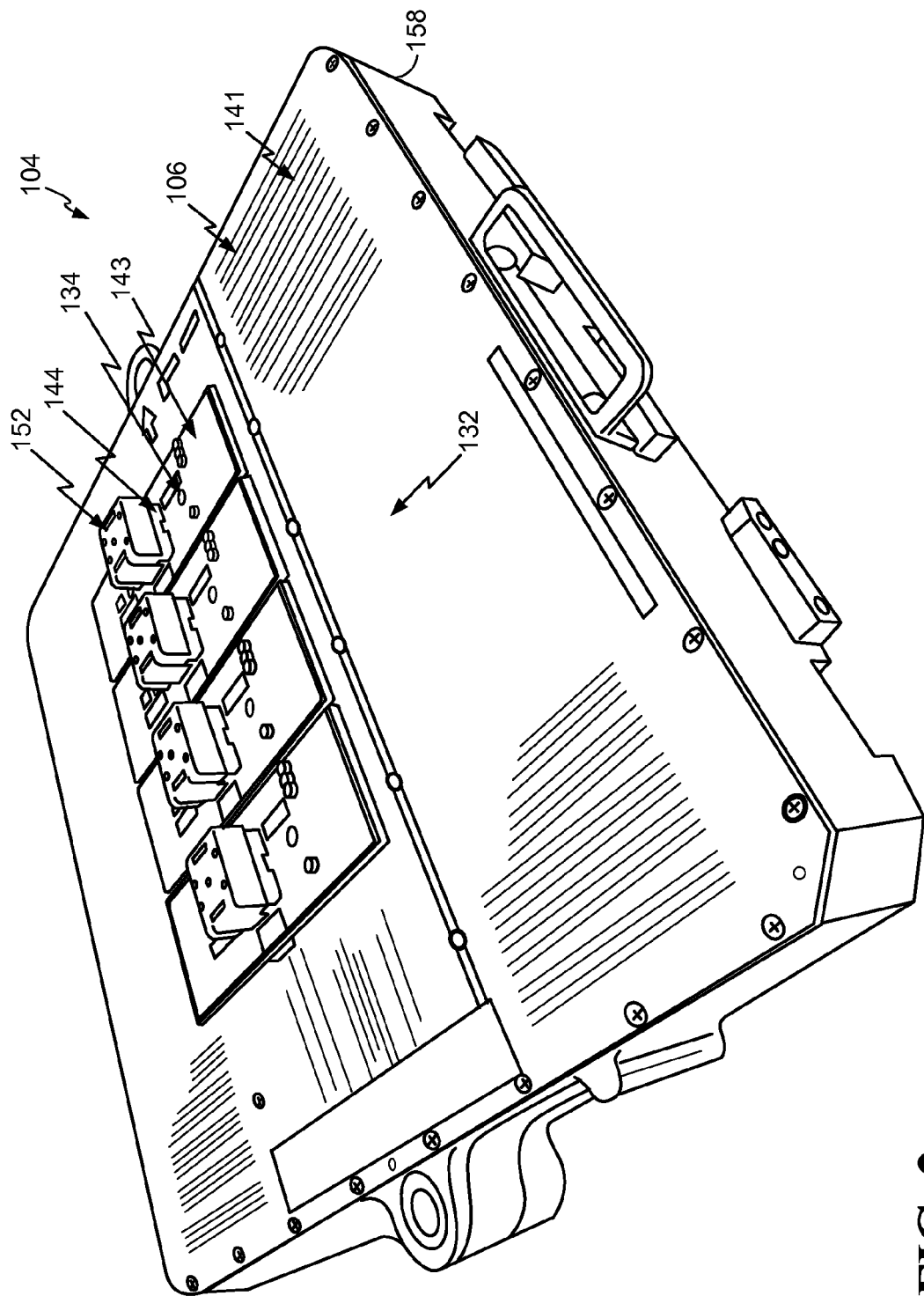
FIG. 2 illustrates a perspective view of the DIB assembly of FIG. 1 with a four daughter card configuration.

In FIG. 2, an exemplary DIB assembly 104 includes a motherboard 106 mounted to a metal stiffening tray 158 that provides mounting provisions to a handler (not shown in FIG. 2). Four daughter cards 108 are shown, each capped by a handler chuck 152.

Figure 3:
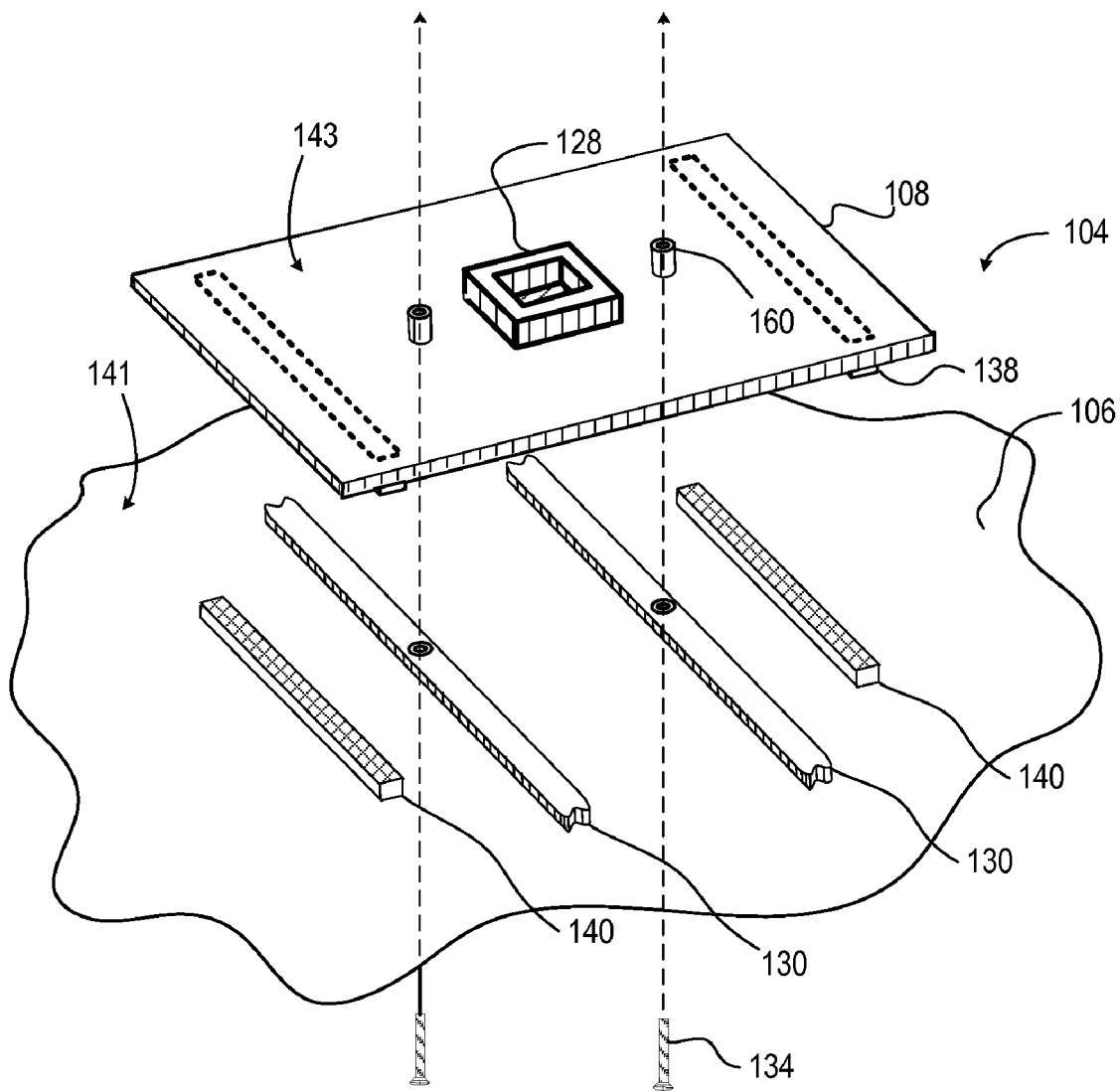
FIG. 3 illustrates an exploded, detail view of a daughter card and an underlying portion of the motherboard of the DIB assembly of FIG. 1.

In FIG. 3, an exemplary DIB assembly 104 provides a modular design wherein a relatively small daughter card 108 can be customized for the desired functionality of the test site 128 and can be physically removed and made independent of the remainder of the common device interface board or universal motherboard 106. Mechanical constraints and considerations maintain the physical integrity for this solution. For example, the support rails 130 receive the loads from the handler (not shown in FIG. 3). The fasteners 134 can be received in internally threaded extensions 160 to guide and register male connectors 138 of the daughter card 108 into female connectors 140 of the motherboard 106.

The low profile mating connectors 138, 140 provide high performance electrical connections for the device under test (DUT). The support rails 130 provide durable mechanical support from the constant chip insertion forces from the handler as well as vibration dampening characteristics to protect the mating connectors 138, 140 from wear over time. The materials may be chosen so as to expand and contract at the same rate as the DIB.

Figure 4:
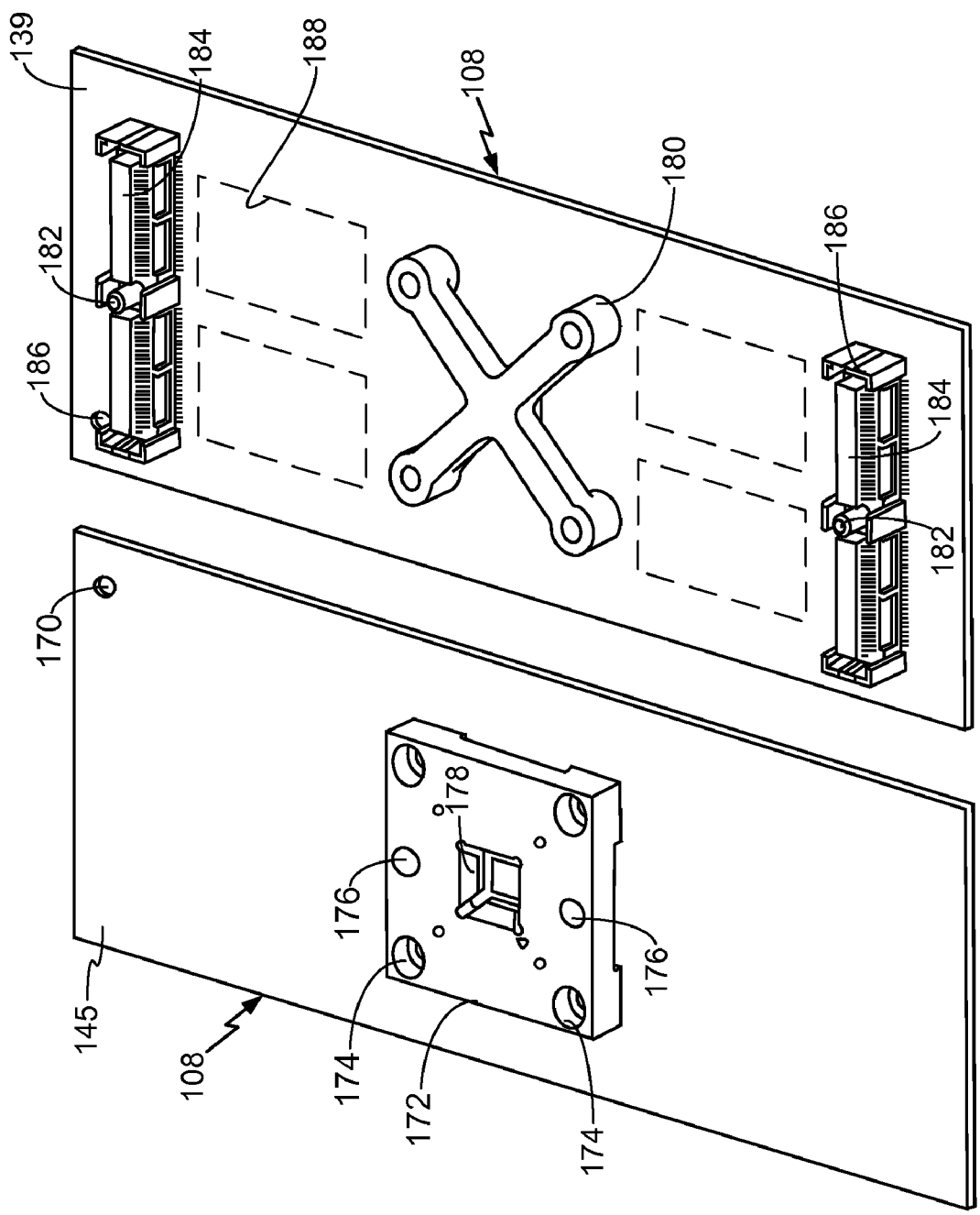
FIG. 4 illustrates a top and a bottom isometric view of the daughter card of FIG. 1.

In FIG. 4, a daughter card 108 includes an upper surface 145 having a guide hole 170 for registering to a motherboard (not shown in FIG. 4). Daughter card 108 further includes a square test site base 172 with corner recessed fastener receptacles 174 and a pair of guide apertures 176 longitudinally positioned about a test site receptacle 178. The daughter card 108 is also depicted having an X-shaped mounting plate 180 on the undersurface 139 of the daughter card 108 for attaching the base 172. On each longitudinal end of the daughter card 108, a respective guide pin 182 flanked by male connectors 184 with locking flanges 186 projects from the undersurface 139 for attachment to the motherboard. Surface 188, which may be utilized for mounting support components, is provided between the connectors 184 and the X-shaped mounting plate 180.

Figure 5:
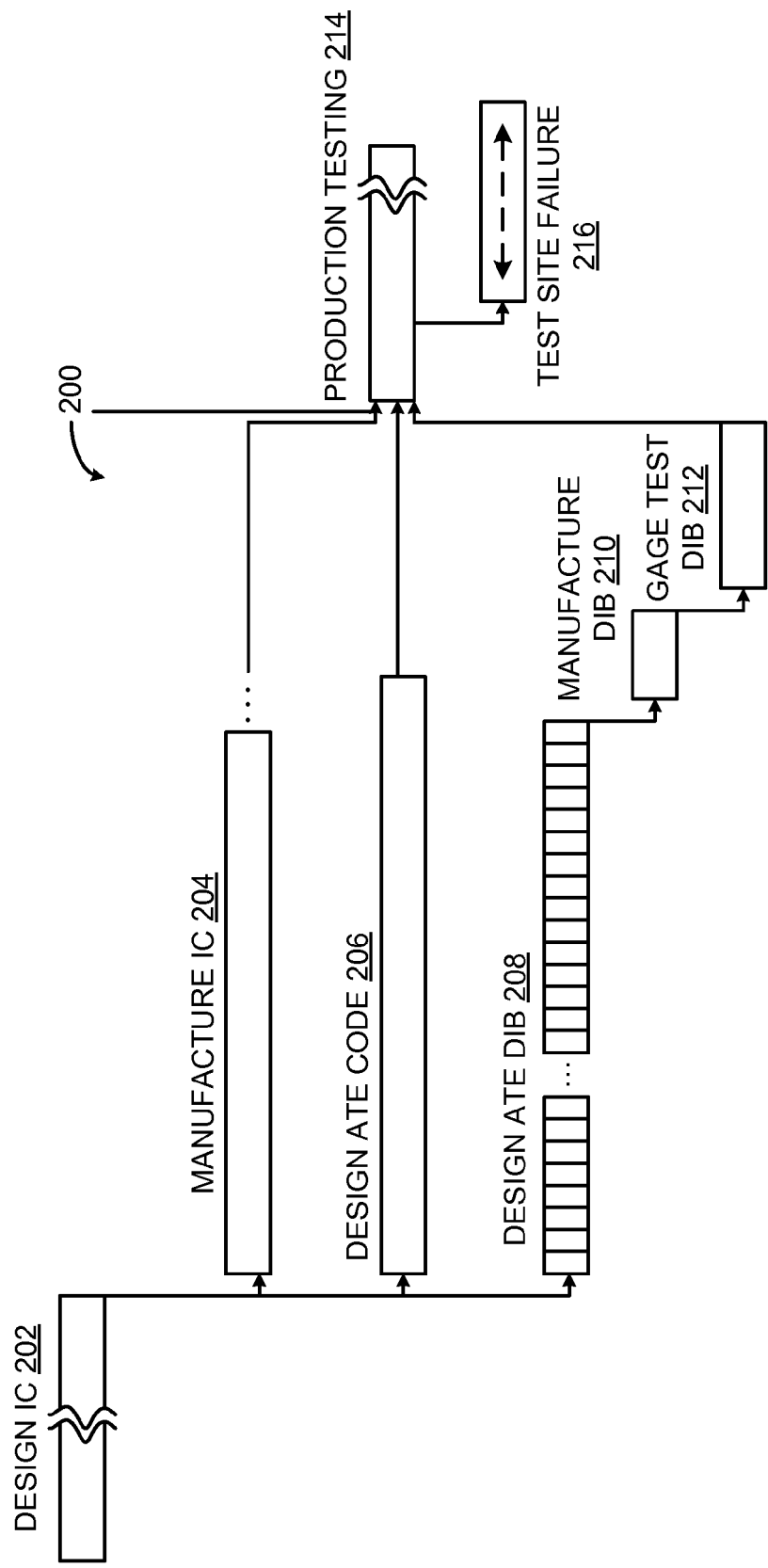
FIG. 5 illustrates a Gantt chart for a methodology for designing an IC device and providing for the validation testing in production with a conventional DIB.

In FIG. 5, a conventional methodology, depicted at 200 presents challenges due to a unitary DIB whose configuration has to wait until the IC is designed (block 202). While the IC is being manufactured in block 204, supporting development has to be completed in order not to jeopardize the time to market goals. One such development is to design and code ATE code for testing in block 206. In parallel with these efforts, an ATE DIB having a unitary design is developed in block 208. In order to support a complex IC, the number of layers can be 22, 24 or more. Due to the large size of the unitary DIB with perhaps a plurality of test sites per DIB, an experienced design engineer can require about a day per layer to design the DIB. Once the DIB design is completed, the DIB is manufactured in block 210. Due to the challenging operating conditions often employed in verification testing, the DIB and other ATE equipment are Gage tested in order to verify that the test results are reliable and repeatable with an acceptable degree of variations in block 212. Then the ICs can be tested to validate the design or to verify the production in block 214. Given the complexity and cost of the DIB, it is frequently the case that a test site on the DIB fails. Rather than taking one ATE setup out of production, often this DIB continues to be used with one test site left unused, thus extending the time required to perform a test, as depicted at block 216.

Figure 6:
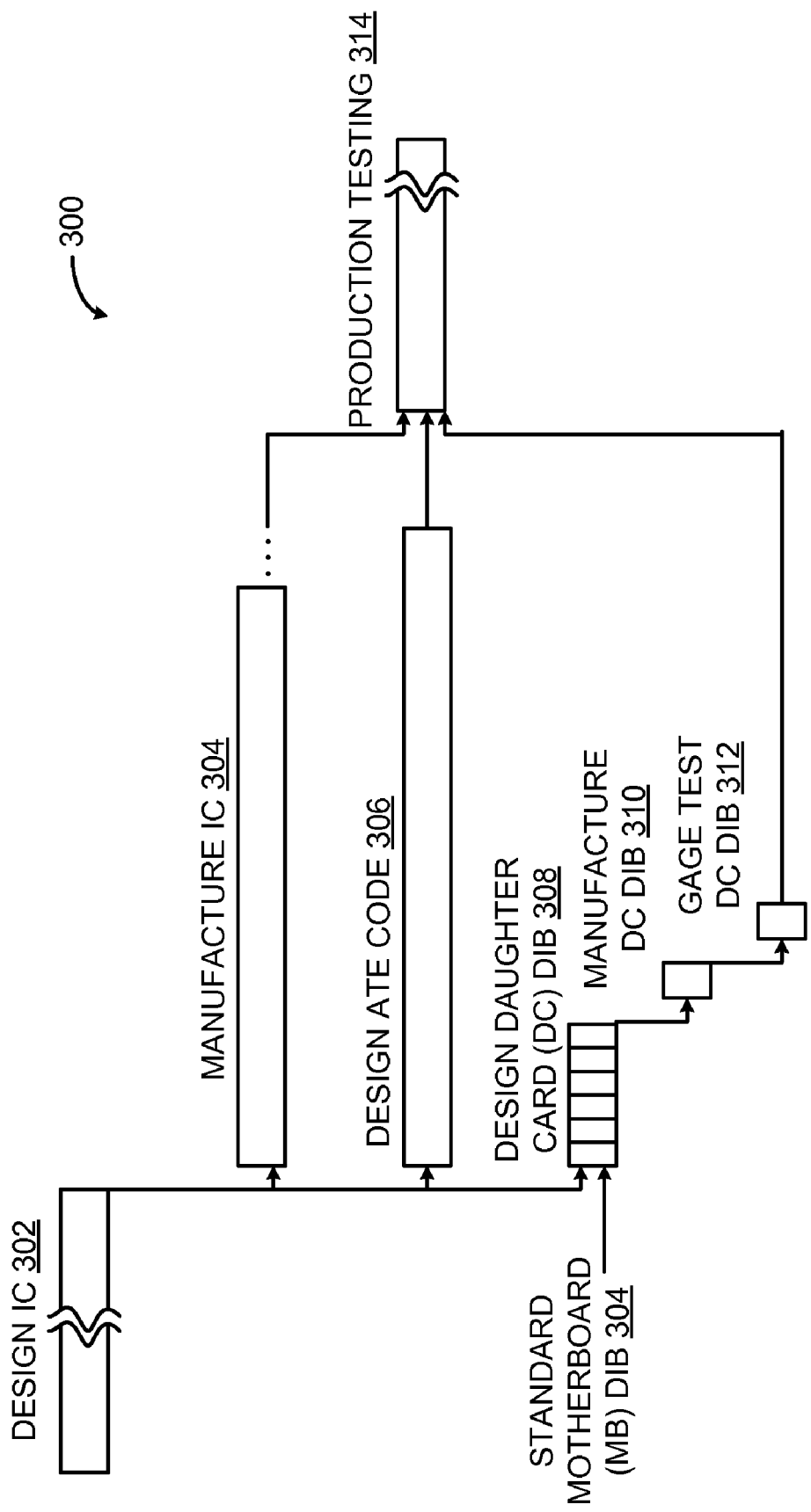
FIG. 6 illustrates a Gantt chart for a methodology for designing an IC device and for providing for the validation testing in production with a DIB assembly.

In FIG. 6, a methodology 300 benefits from a DIB assembly of a motherboard and one or more independent daughter cards. Thus, while an IC is being designed in block 302, a standard or universal motherboard (MB) DIB can be prepared or provisioned, as depicted at 304. In particular, a pre-existing MB DIB can be readied or a new MB DIB can be designed and fabricated with excess capabilities to accommodate a future, incomplete IC design. With the IC design complete and manufacture of a semiconductor underway as depicted in block 306, the supporting developments can be expedited without endangering the critical path of design, testing, debugging and verification of the IC itself. In particular, the ATE code is designed and written in block 308. In parallel with the code, a single daughter card portion of the DIB assembly is designed in block 310. Given the small size of each test site, and the fact that each test site has a standard form, fit and function, a less experienced design engineer is readily able to design a modular PCB with supporting electronic components in a much smaller span of time. These factors also result in a shorter and less expensive manufacturing process for the daughter card at block 312 and Gage testing of the resulting testing apparatus in block 314. In addition, when design validation or production verification testing begins in block 316, failures of a particular daughter card can be readily remedied with a provisioned spare. The provisioned space, which is an inexpensive replacement, provides an economic advantage over the delays and expenses in shipping and repairing a large conventional unitary DIB.

Figure 7:
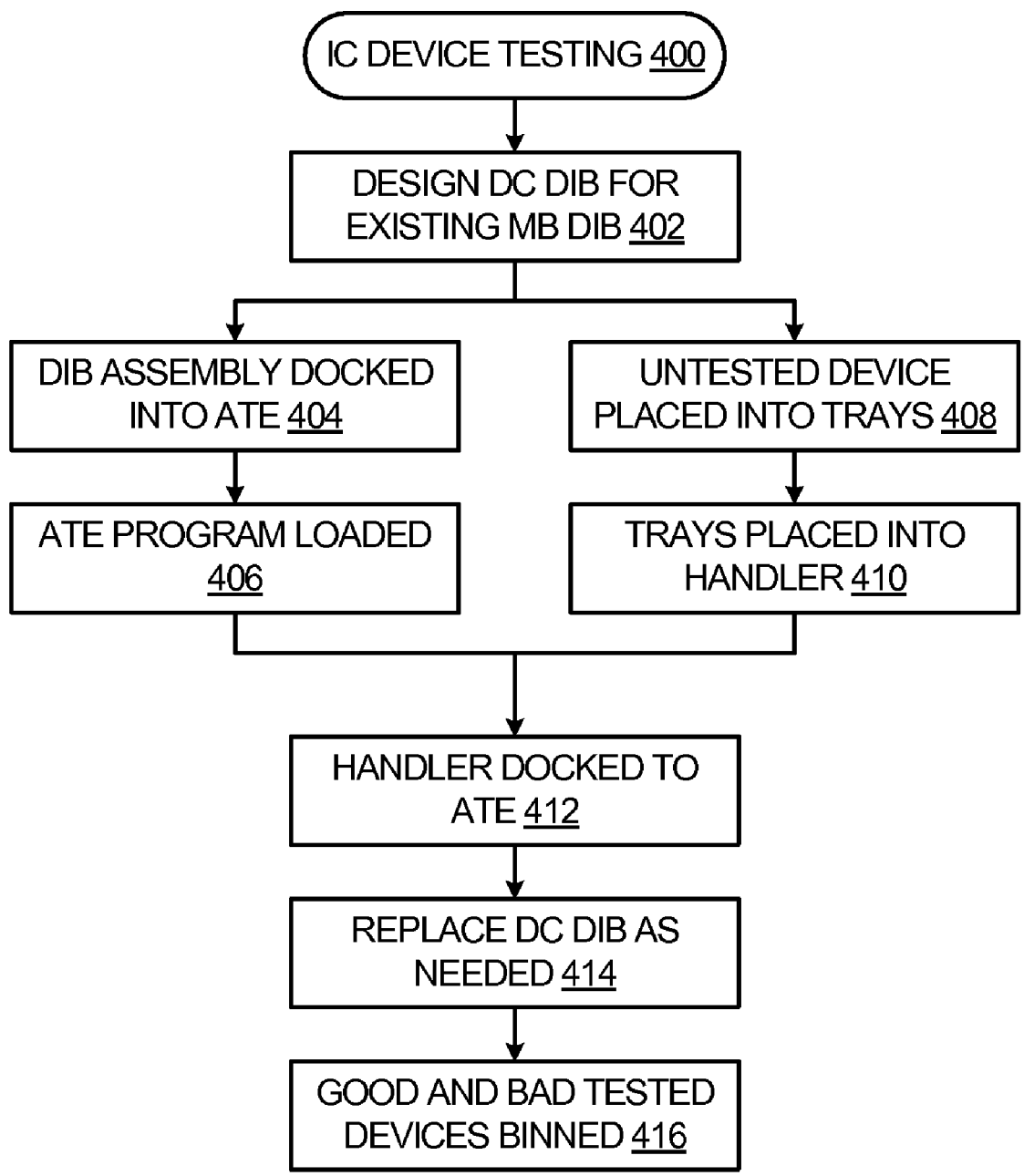
FIG. 7 illustrates a flow diagram of a methodology for IC device testing.

In FIG. 7, a methodology 400 for IC device testing that leverages the considerable investment to date in ATE and handler equipment is enhanced by use of a DIB assembly of a motherboard and one or more independent daughter card(s) as compared to a conventional unitary DIB. In block 402, the modest design and manufacturing effort required for a daughter card can be performed, taking advantage of the existing universal motherboard. Then testing can commence. In particular, one or more daughter cards are attached to the motherboard to form a DIB assembly that is docked to the ATE in block 404. The ATE program code is loaded into the ATE in block 406. Meanwhile, the untested devices are placed into trays in block 408 that are then placed into the handler in block 410. The handler can then be docked to the ATE to commence design validation or production verification testing in block 412. Since the daughter cards of the DIB assembly are subject to damage from wear, impact and vibration more so than the supporting motherboard, instances may occur in block 414 when a test site fails, which can be quickly and economically remedied by replacing the failed daughter card. As DUTs leave testing, the good and bad tested devices are binned for delivery or rework/scrap, respectively, in block 416.

The word "exemplary" is used herein to mean serving as an example, instance, or illustration. Any aspect or design described herein as "exemplary" is not necessarily to be construed as preferred or advantageous over other aspects or designs.

In view of the exemplary systems described supra, methodologies that may be implemented in accordance with the disclosed subject matter have been described with reference to several flow diagrams. While for purposes of simplicity of explanation, the methodologies are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methodologies described herein. Additionally, it should be further appreciated that the methodologies disclosed herein are capable of being stored on an article of manufacture to facilitate transporting and transferring such methodologies to computers. The term article of manufacture, as used herein, is intended to encompass a computer program accessible from any computer-readable device, carrier, or media.

Those skilled in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduced data magnetically, while discs reproduced data optically with lasers. Combinations of the above should also be included within the scope of computer-readable media.

It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

What is claimed is:

1. An apparatus for reduced time to market and enhanced economy for design validation and production verification testing, comprising:

a common device interface board (DIB) sized for and electrically interfaced for being received by automated test equipment and comprising a plurality of card mounting fixtures;

a plurality of daughter cards attached respectively to the corresponding plurality of card mounting fixtures and electrically interfacing thereby to the automated test equipment via the common DIB to form a DIB assembly; and a test site attached to each of the plurality of daughter cards and positioned by the DIB assembly for receiving a plurality of integrated devices simultaneously from a handler for concurrent testing.

2. The apparatus of claim 1, further comprising a disengagable attachment between each of the plurality of daughter cards and the common DIB for repair replacement.

3. The apparatus of claim 1, further comprising a disengagable attachment between each daughter card and the common DIB for replacement of a failed daughter card to facilitate full-rate testing.

4. The apparatus of claim 1, wherein each card mounting fixture is identical and each daughter card is identical for simplified design and provisioning.

5. The apparatus of claim 1, wherein the common DIB and the plurality of daughter cards are positioned so as to define a spacing sufficient for mounting electronic components between an undersurface of the plurality of daughter cards and an upper surface of the common DIB, and further comprising electronic components mounted on the undersurface of the plurality of daughter cards for electrically supporting the plurality of integrated devices under test.

6. A method for reduced time to market and enhanced economy for design validation and production verification testing, comprising:

creating a common device interface board (DIB) sized for and electrically interfaced for being received by automated test equipment and presenting a plurality of card mounting fixtures;

attaching a plurality of daughter cards respectively to the corresponding plurality of card mounting fixtures and electrically interfacing thereby to the automated test equipment via the common DIB to form a DIB assembly; and simultaneously inserting a plurality of integrated devices with a handler for concurrent testing in a test site attached to a respective daughter card.

7. The method of claim 6, further comprising disengaging the attachment between each of the plurality of daughter cards and the common DIB for repair replacement with another daughter card.

8. The method of claim 6, further comprising disengaging an attachment between one failed daughter card and the common DIB for replacement with another daughter card to facilitate full-rate testing.

9. The method of claim 6, further comprising creating an identical plurality of card mounting fixtures and an identical plurality of daughter cards for simplified design and provisioning.

10. The method of claim 6, further comprising creating the plurality of card mounting fixtures of the common DIB with a support structure spacing an undersurface of the plurality of daughter cards from an upper surface of the common DIB, the spacing corresponding to low profile electrical connectors between the plurality of daughter cards and the common DIB and sufficient for electronic components mounted on the undersurface of the plurality of daughter cards for electrically supporting the plurality of integrated devices under test.

11. An apparatus for reduced time to market and enhanced economy for design validation and production verification testing, comprising:

means for creating a common device interface board (DIB) sized for and electrically interfaced for being received by automated test equipment and presenting a plurality of card mounting fixtures;

means for attaching a plurality of daughter cards respectively to the corresponding plurality of card mounting fixtures and electrically interfacing thereby to the automated test equipment via the common DIB to form a DIB assembly; and means for simultaneously inserting a plurality of integrated devices with a handler for concurrent testing in a respective test site attached to a respective daughter card.

12. The apparatus of claim 11, further comprising means for disengaging the attachment between at least one of the plurality of the daughter cards and the common DIB for repair replacement with another daughter card.

13. The apparatus of claim 11, further comprising means for disengaging an attachment between one failed daughter card and the common DIB for replacement with another daughter card to facilitate full-rate testing.

14. The apparatus of claim 11, further comprising means for creating an identical plurality of card mounting fixtures and an identical plurality of daughter cards for simplified design and provisioning.

15. The apparatus of claim 11, further comprising means for creating the card mounting fixture of the common DIB with a support structure spacing an undersurface of the plurality of daughter cards from an upper surface of the common DIB, the spacing corresponding to low profile electrical connectors between the plurality of daughter cards and the common DIB and sufficient for electronic components mounted on the undersurface of the plurality of daughter cards for electrically supporting the plurality of integrated devices under test.

* * * * *